Jan. 17, 1956 G. R. GAMERTSFELDER 2,731,595

PHASE SHIFTING CIRCUIT

Filed Dec. 18, 1945

INVENTOR
GEORGE R. GAMERTSFELDER

BY [signature]

ATTORNEY

United States Patent Office 2,731,595

Patented Jan. 17, 1956

2,731,595

PHASE SHIFTING CIRCUIT

George R. Gamertsfelder, Watertown, Mass., assignor, by mesne assignments, to the United States of America as represented by the Secretary of the Navy Application December 18, 1945, Serial No. 635,789

2 Claims. (Cl. 323—119)

This invention relates to electrical phase shifting apparatus and more specifically to such apparatus particularly adaptable to shifting the phase of intermittent electrical oscillations.

Heretofore, the phase of a sine wave oscillation has been shifted by impressing said oscillation across a complex impedance and by picking the desired phase shifted signal off the proper parameters or combinations thereof. This technique is suitable for phase shifting a continuous wave oscillation; but when intermittent or pulsed oscillations are impressed across such a complex impedance whose pick-off parameters are large enough to provide a large output signal, the transient time constant of the impedance is too long and the D.-C. level of the output signal, instead of being constant, varies exponentially. The time constant can be shortened by making the pick-off parameters small, but the phase shifted output must then be greatly amplified since there is a considerable signal loss by voltage divider action. This is not desirable in most instances as any gain instability of the amplifier will cause amplitude fluctuation of the output.

A specific object of the present invention is to provide a sine wave substantially equal in amplitude to a given sine wave and displaced in phase therefrom by a desired amount.

Another object is to provide a phase shifted sine wave whose amplitude is constant and independent of the gain of the electronic circuits employed to amplify said sine wave.

A further object is to provide a stable phase shifting network operative with pulsed or continuous signal input whose transient time constant is extremely short.

A still further object is to provide sine waves of sufficient stability and phase accuracy to be used for driving a precision, balanced, polyphase system.

To achieve these ends, a portion of the phase shifting network across which the reference sine wave is impressed is used as a degenerative feedback loop from the output to the input of a high gain amplifier. The amplifier causes the network to have a short transient time constant by reducing the network's effective impedance and amplifies the phase shifted output wave until it is equal in amplitude to the input reference signal.

The details and features of the present invention are described in the following specification and shown in the accompanying figures of which:

Figure 1:
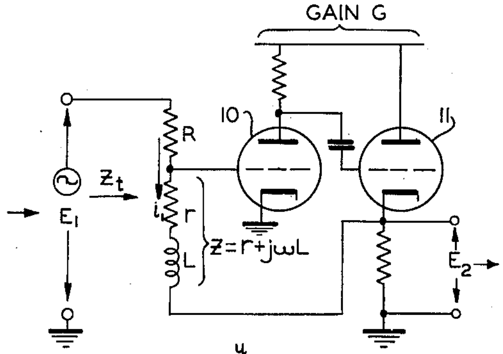
Fig. 1 is a diagram of the basic phase shifting circuit of this invention.

Referring to the drawing and more particular to Fig. 1, a phase shifting circuit is shown, comprising a phase shifting network made up of resistances R and $r$, and inductance L and offering an effective input impedance $Z_t$, a triode amplifier stage 10, a cathode follower driver stage 11 whose grid is capacitively coupled to the plate output of stage 10, and a degenerative feedback loop from the output of the cathode follower 11 to the grid input of the amplifier 10 made up of elements $r$ and L of the phase shifting network. An input signal, preferably a pure sine wave voltage, either pulsed or continuous wave and having an amplitude $E_1$ is impressed across the input impedance $Z_t$. A portion of this signal having a phase and amplitude determined by the effective input impedance of stage 10 is amplified by stages 10 and 11 having an overall gain G and appears at the output of the cathode follower 11 as a sine wave shifted in phase relative to the incoming signal and having an amplitude $E_2$.

Figure 1A:
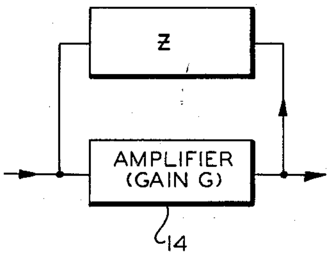
Fig. 1A is a block diagram showing the impedance feedback loop.

The effective impedance of elements $r$ and L in the degenerative feedback loop of Fig. 1 is dependent upon the overall gain G of the stages 10 and 11. As shown in Fig. 1A, stages 10 and 11 may be considered an amplifier 14 of gain G shunted by feedback impedance Z which is equal to the complex expression $r+jwL$. It is well known in the art that shunt impedance Z appears at the input of the amplifier 14 as an impedance to ground with a value given by the expression $$\frac{Z}{G+1}$$

Elements $r$ and L of Fig. 1 thus have effective values $$\frac{r}{G+1}$$

and $$\frac{L}{G+1}$$

and their series impedance is $$\frac{Z}{G+1}$$

By the voltage divider action resulting from the grid of the amplifier 10 being tapped to a portion of the input phase shifted network, a phase shifted sine wave signal $e_s$ is fed to the grid of stage 10 having an amplitude $$|e_s|=\frac{\frac{Z}{G+1}}{Z_t}|E_1|$$

After going through stages 10 and 11, the input sine wave appears at the output of the cathode follower 11 with an increased amplitude $|E_2|$ given by the expression $$|E_2|=\frac{G}{G+1}\frac{Z}{Z_t}|E_1|$$

Figures 2, 2A, 3:
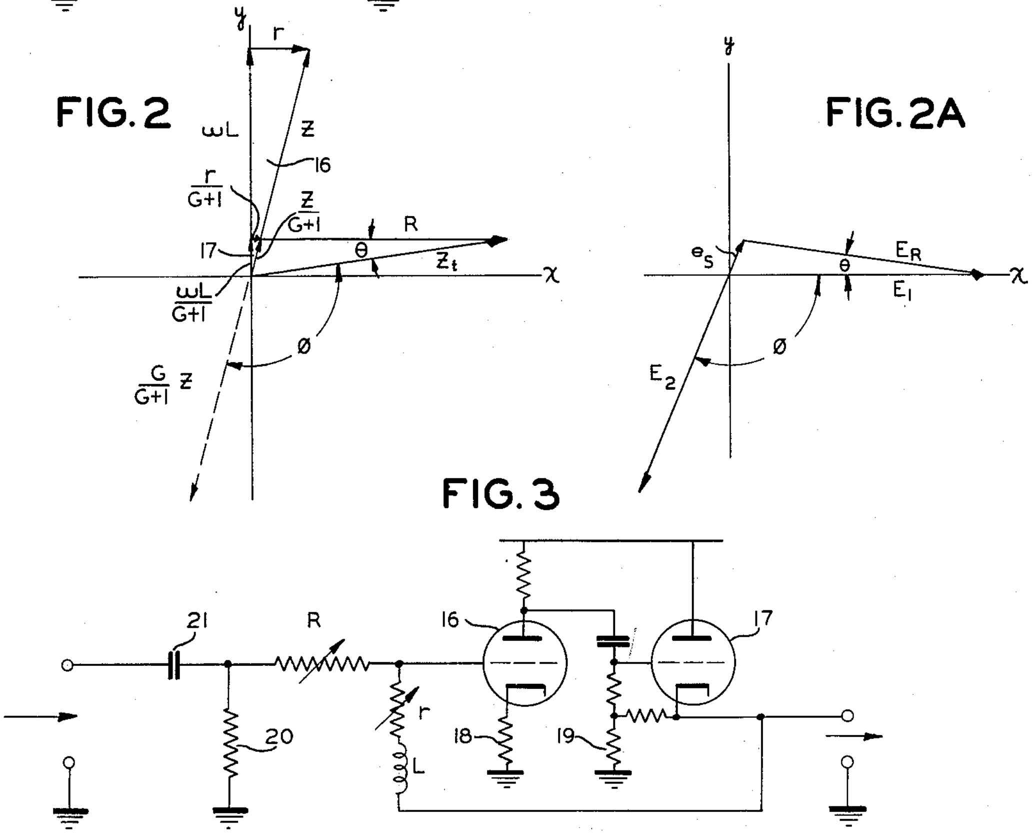
Fig. 2 is the impedance vector diagram of the circuit of Fig. 1.
Fig. 2A is the related voltage vector diagram.
Fig. 3 is a diagram of an actual circuit used which is merely a slight modification of the circuit of Fig. 1.

The circuit of Fig. 1 can best be analyzed vectorially, and Figs. 2 and 2A show the impedance and voltage vectors involved. Referring specifically to Fig. 2, the impedance triangle 16 formed by the degenerative feedback loop is shown, with resultant vector Z made up of two component vectors $r$ and $jw$L. By the action of the amplifier (14 of Fig. 1A), the impedances of the triangle 16 are reduced by the factor $$\frac{1}{G+1}$$

(G being the amplifier gain) and a reduced similar triangle 17 is thereby formed. Resistance R of Fig. 1 is added in series to the vectors of the reduced triangle 17 and the resultant vector $Z_t$ of this addition is the overall impedance of the phase shifting network.

Now turning to voltage considerations, the related voltage vectors are shown in Fig. 2A and are obtained by multiplying the vectors of Fig. 2 by current $$i_1=\frac{E_1}{Z_t}$$

With input voltage $E_1$ as a reference, voltage $E_R$ across resistor R and voltage $e_s$ going to the amplifier are shown. In the amplifier, vector $e_s$ is increased by the gain factor G and reversed 180° in phase, producing a resultant output signal vector $E_2$.

With the circuit of Fig. 1, control of both the amplitude and the phase of vector $E_2$ is possible. As Fig. 2 indicates, the phase angle $\phi$ is determined primarily by the angle of vector Z, which is in turn dependent upon parameters $r$ and L, and secondarily by resistance R and amplifier gain G which help define the small angle $\theta$. However, for G and R large, the working equation for phase angle is $$\phi=180°-\tan^{-1}\frac{\omega L}{r}$$

The means of controlling the relative amplitudes of voltages $E_1$ and $E_2$ can be seen from the equation $$E_2=\frac{G}{G+1}\frac{Z}{Z_t}E_1$$

Gain G is made large so that the factor $$\frac{G}{G+1}$$

approximately equals one and the amplitude of signal $E_2$ is made substantially independent of any fluctuations in gain. The vector Z is used for phase control as shown above, leaving $Z_t$ as the amplitude controlling factor. $Z_t$ itself is determined principally by the value of resistance R which is made variable for the desired amplitude control.

Consider now the transient time constant of the circuit of Fig. 1. As shown above, the input impedance effectively consists of resistance R in series with resistance.

$$\frac{r}{G+1}$$

and inductance $$\frac{L}{G+1}$$

The time constant of these elements is given by the following expression which is graphically signified by the angle $\theta$ of Fig. 2.

$$\tau=\frac{\frac{L}{G+1}}{R+\frac{r}{G+1}}=\frac{1}{\omega}\tan\theta$$

For an output signal of amplitude comparable to that of the input, R is made approximately equal to the magnitude of Z, and $\tau$ is made extremely small (a fraction of a period) by making gain G large as is also desirable for amplitude stability.

Fig. 3 shows an actual circuit used and this deviates from that of Fig. 1 in minor aspects only. Resistance R is variable for amplitude control and resistance $r$ offers the desired phase adjustment. The resistance 18 in the cathode of stage 16 provides stability and the resistance 19 in the cathode of stage 17 biases that stage into its linear region of operation so that a large undistorted output may be had. Resistor 20 and capacitor 21 comprise an input coupling network.

Figure 4:
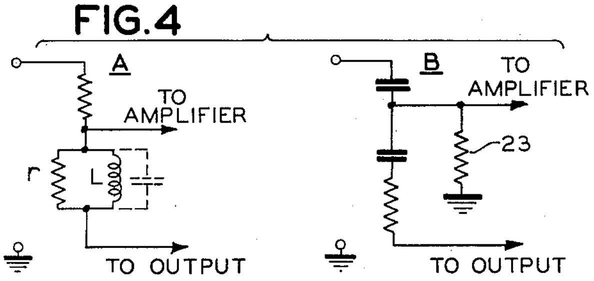
Fig. 4 shows two of the many other phase shifting networks which may be used with the present invention.

The invention is not limited to the phase shifting network of Figs. 1 and 3 and two of many other possible networks are shown in Fig. 4. Network A employs parameters $r$ and L in parallel and has the advantage that any resonances set up in coil L due to its distributed capacitance are quickly damped by shunt resistance $r$. Network B is a capacitance divider circuit which may be used, and which requires a resistance 23 to ground for D.-C. return.

The apparatus of this invention may be used to supply voltages to a balanced three phase system by employing two of the phase shifting circuits in series, each designed for 120° phase shift and for output signals equal in amplitude to the input. Polyphase systems of more than three phases may also be driven by an extension of the above technique.

Thus, with the present invention it is possible to provide a stable wave shifted in phase by a desired amount relative to an input wave and having an amplitude equal to that of the input wave. The circuit of this invention has a short transient time constant and may be used for phase shifting a pulsed or intermittent wave as well as a continuous wave.

The invention described in the foregoing specification need not be limited to the details shown, which are considered to be illustrative of one form the invention may take. What I desire to secure by Letters Patent and claim is:

1. A device comprising an impedance network made up of resistance and inductive elements, an electronic amplifier whose grid input is tapped to a portion of said impedance network, a second electronic stage connected as a cathode follower and having its grid capacitively coupled to the output of said amplifier, one end of said impedance network being tied to the cathode of said cathode follower so as to form a degenerative feedback loop from the output of said cathode follower to the input of said amplifier, whereby the impedance of that portion of said impedance network used as a degenerative feedback loop is so affected by the overall gain of said amplifier as to cause an effective shortening of the transient time constant of said impedance network.

2. Electrical apparatus comprising a capacitively coupled input lead tied to ground through a first large resistor, a single amplifier stage whose grid is connected to the ungrounded end of said first resistor through a second variable resistor, a cathode follower stage whose grid is capacitively coupled to the plate of said amplifier stage and resistively coupled to a tap on the cathode resistor of said cathode follower, the cathode of said cathode follower being coupled to the grid of said amplifier stage through an inductance and a variable resistor.

References Cited in the file of this patent

FOREIGN PATENTS 515,158 Great Britain ---------- Nov. 28, 1939